(12) United States Patent
Ho et al.

(10) Patent No.: US 6,737,334 B2
(45) Date of Patent: May 18, 2004

(54) METHOD OF FABRICATING A SHALLOW TRENCH ISOLATION STRUCTURE

(75) Inventors: Tzu-En Ho, Ilan (TW); Chang Rong Wu, Banchiau (TW); Yi-Nan Chen, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/268,522

(22) Filed: Oct. 9, 2002

(65) Prior Publication Data

US 2003/0199151 A1 Oct. 23, 2003

(30) Foreign Application Priority Data

Apr. 18, 2002 (TW) ........................ 91107977 A

(51) Int. Cl.$^7$ ..................... H01L 21/8242; H01L 21/76; H01L 21/302
(52) U.S. Cl. ................ 438/424; 438/243; 438/244; 438/430; 438/435; 438/524; 438/745; 438/749; 438/751; 438/756
(58) Field of Search ................ 438/243, 244, 438/424, 430, 435, 524, 745, 749, 751, 756

(56) References Cited

U.S. PATENT DOCUMENTS

| | | | | |
|---|---|---|---|---|
| 4,835,115 A | * | 5/1989 | Eklund | ............ 438/426 |
| 5,099,304 A | * | 3/1992 | Takemura et al. | ........... 257/647 |
| 5,940,717 A | * | 8/1999 | Rengarajan et al. | ........ 438/435 |
| 6,132,522 A | * | 10/2000 | Verhaverbeke et al. | ....... 134/26 |
| 6,180,490 B1 | * | 1/2001 | Vassiliev et al. | ............. 438/424 |
| 6,277,709 B1 | * | 8/2001 | Wang et al. | ................. 438/430 |
| 6,300,219 B1 | * | 10/2001 | Doan et al. | ................. 438/424 |
| 6,333,274 B2 | * | 12/2001 | Akatsu et al. | .............. 438/745 |
| 6,531,377 B2 | * | 3/2003 | Knorr et al. | ................ 438/435 |
| 6,596,607 B2 | * | 7/2003 | Ahn | .......................... 438/424 |
| 2002/0072198 A1 | * | 6/2002 | Ahn | .......................... 438/424 |
| 2002/0123006 A1 | * | 9/2002 | Hong | |
| 2002/0123206 A1 | * | 9/2002 | Hong et al. | ................. 438/424 |
| 2003/0013271 A1 | * | 1/2003 | Knorr et al. | ................ 438/435 |

* cited by examiner

*Primary Examiner*—John F. Niebling
*Assistant Examiner*—Stanetta Isaac
(74) *Attorney, Agent, or Firm*—Ladas & Parry

(57) ABSTRACT

A method for fabricating STI for semiconductor device. The method includes the following steps. A trench is formed on the semiconductor substrate, a liner oxide is formed on the bottom and sidewall of the trench, and then a liner nitride is formed on the liner oxide. The first oxide layer is deposited in the trench by high density plasma chemical vapor deposition. The first oxide layer is spray-etched to a predetermined depth, wherein the recipe of the spray etching solution is $HF/H_2SO_4=0.3~0.4$. A second oxide layer is deposited to fill the trench by high density plasma chemical vapor deposition to form a shallow trench isolation structure.

19 Claims, 4 Drawing Sheets

METHOD OF FABRICATING A SHALLOW TRENCH ISOLATION STRUCTURE

BACKGROUND OF THE INVENTION

1. Field of the Invention

The present invention relates to a method for forming a semiconductor device. More particularly, the present invention relates to a method for fabricating a shallow trench isolation (STI) structure.

2. Description of the Related Art

Advances in the production of integrated circuits have led to an increase in the level of integration and the miniaturization of semiconductor devices. As the level of integration increases, both the dimensions of each device and size of the isolating structures between devices are reduced. Consequently, device isolation structures are increasingly harder to form. A device isolation structure such as a field oxide layer formed by local oxidation (LOCOS) is no longer suitable for small dimensional devices due to the intensification of bird's beak encroachment. Therefore, the shallow trench isolation (STI) method has been developed for highly integrated circuits, and, in particular, sub-half micron integrated circuits.

A typical process for shallow trench isolation fabrication generally includes the following steps. First, a shallow trench is formed in a semiconductor substrate by selective etching. Second, an insulating layer is deposited on the entire surface of the semiconductor substrate to fill the trench. The insulating layer is typically formed of silicon dioxide by chemical vapor deposition (CVD), such as atmospheric pressure chemical vapor deposition (APCVD), sub-atmospheric pressure chemical vapor deposition (SACVD) or high density plasma CVD (HDPCVD). Finally, CMP is used to planarize the insulating layer, thus the insulating layer remaining in the trench serves as a STI region.

Because of the increasing complexity of electronic devices, the dimensions of semiconductor devices are shrinking, while the width of STI regions is decreasing to 0.11 μm or less, and the aspect ratio of STI regions is increasing beyond 3. Even if a HDPCVD with good filling capability is employed, voids or seams still exist in the STI regions and one-step coverage is hard to achieve. When conductive materials are deposited in subsequent processes, these defects cause short circuits between devices, thus reducing the lifetime of the device.

BRIEF SUMMARY OF THE INVENTION

The object of the present invention is to solve the above-mentioned problems and to provide a method of fabricating a high aspect ratio shallow trench isolation structure.

The present invention discloses a method of fabricating a shallow trench isolation structure in a semiconductor substrate, comprising the following steps. A trench is formed on the semiconductor substrate. A liner oxide is formed on the bottom and sidewall of the trench. A liner nitride is formed on the liner oxide. The first oxide layer is deposited in the trench by high density plasma chemical vapor deposition. The first oxide layer is spray-etched to a predetermined depth, wherein the recipe of the spray etching solution is $HF/H_2SO_4$=0.3~0.4. A second oxide layer is deposited to fill the trench by high density plasma chemical vapor deposition (HDPCVD).

In a preferred embodiment, the aspect ratio of the trench is greater than 3. The second oxide layer, i.e. an HDP oxide layer, can be annealed to increase the density thereof after the second oxide layer is deposited and the second oxide layer can be subsequently planarized by chemical mechanical polishing (CMP) to form a well-filled shallow trench isolation structure.

In another preferred embodiment, the trench can be formed by reactive ion etching (RIE). The liner oxide cab be formed by thermal oxidation and the liner nitride can be formed by low pressure CVD (LPCVD).

The preferred thickness of the first oxide layer in the trench is about 2000–5000 Å. The preferred recipe of the spray etching solution is $HF:H_2SO_4$=1:2 and the spray etching is performed for 20–30 seconds. The preferred thickness of the second oxide layer in the trench is about 3000–6000 Å. The first and second oxide layer can be silane based HDP oxide.

BRIEF DESCRIPTION OF THE DRAWINGS

The present invention will become more fully understood from the detailed description given herein below and the accompanying drawings, given by way of illustration only and thus not intended to be limitative of the present invention. In the drawings.

DETAILED DESCRIPTION OF THE INVENTION

Figure 1A:
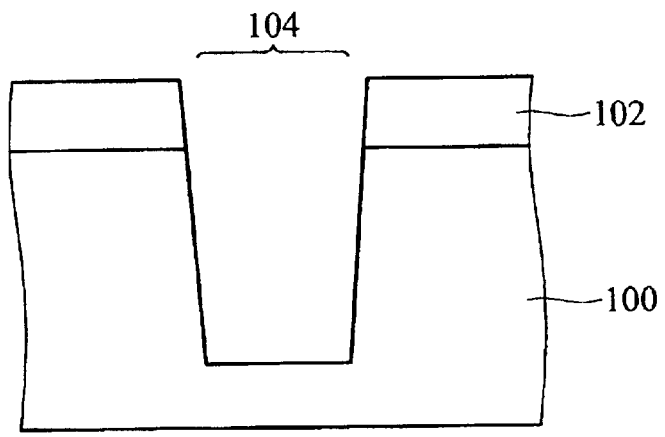
FIGS. 1A~1G illustrate, in cross section, the fabrication process of a shallow trench isolation structure in one embodiment according to the present invention.
Figure 1B:
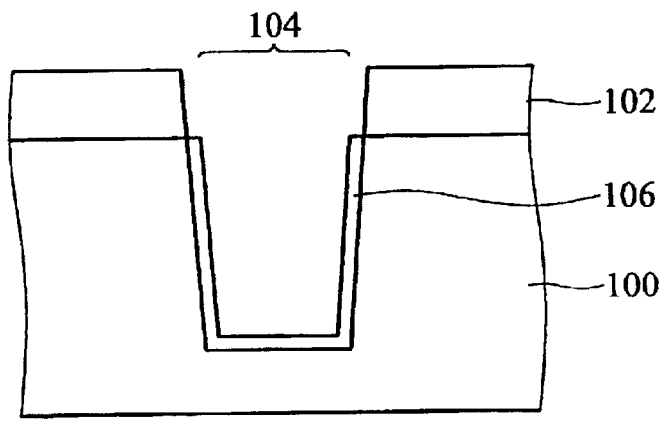

FIGS. 1A~1G illustrate, in cross section, the fabrication process of a shallow trench isolation structure in one embodiment according to the present invention.

As shown in FIG. 1, a nitride layer (SiN) 102 is formed by low pressure CVD (LPCVD) over the surface of a semiconductor silicon substrate 100. A photo-resist layer (not shown) is patterned by photolithography to form a certain pattern corresponding to the subsequently formed trench on the nitride layer 102. The nitride layer 102 is etched with the patterned photo-resist layer as a mask to form a patterned nitride 102 as a hard mask. A shallow trench isolation structure 104 is formed on the silicon substrate 100 by reactive ion etching (RIE) with the silica nitride 102 as the hard mask. The depth of the shallow trench isolation structure 104 is about 3000~5000 Å and the width of the opening there of is about 1000 Å. The preferred aspect ratio (depth/width) of the trench 104 is about or greater than 3.

The silicon substrate 100 is subjected to thermal oxidation to grow a liner oxide layer ($SiO_2$) 106 on the bottom and sidewall of the trench 104. The thermal oxidation can be wet thermal oxidation performed in a oxygen-hydrogen-containing atmosphere at 800 to 850° C., or dry thermal oxidation performed in a oxygen-containing atmosphere at 900 to 950° C. for 2 hours. The inner silicon of the trench 104 is oxidized by the thermal oxidation to form the liner oxide 106 with a thickness of 100~200 Å.

Figure 1C:
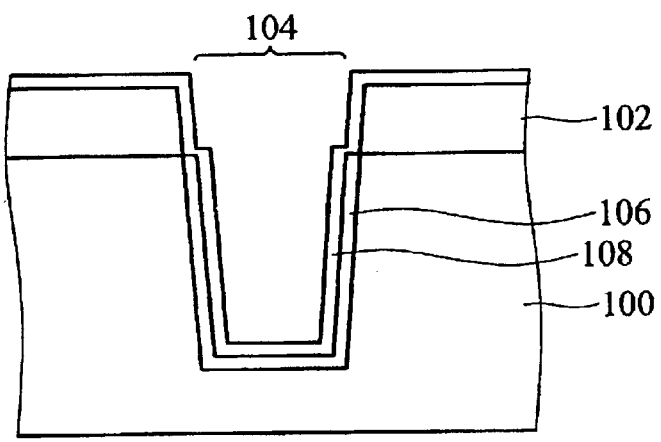

After the liner oxide layer 106 is grown on the inner of the trench 104, a nitride layer (SiN) 108 is formed over the liner oxide layer 106 in the trench 104 and the nitride layer 102 to protect the profile of the trench 104, as FIG. 1C shows.

Figure 1D:
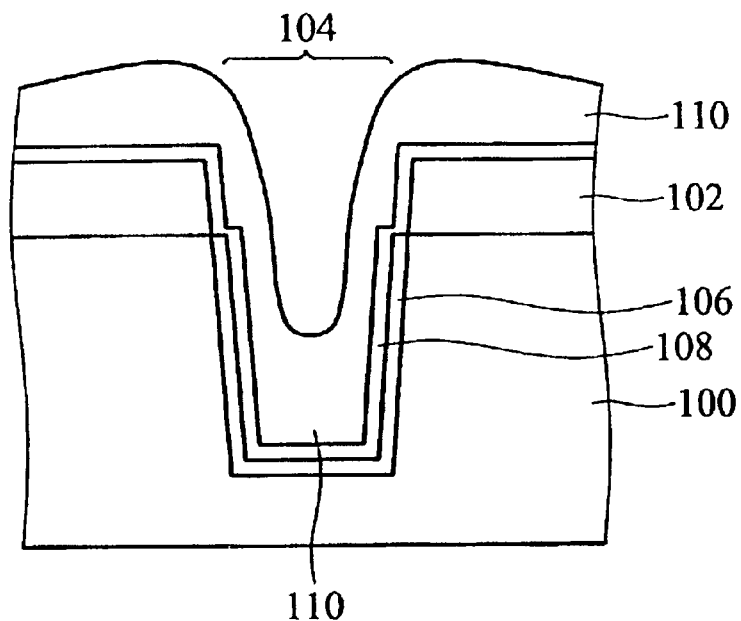

AS shown in FIG. 1D, a first oxide layer 110 is deposited as an insulating layer, i.e. HDP oxide, in silane and oxygen by high density plasma chemical vapor deposition (HDPCVD). The preferred deposition thickness is about 2000~5000 Å, and a more preferred thickness is about 3000 Å.

Figure 1E:
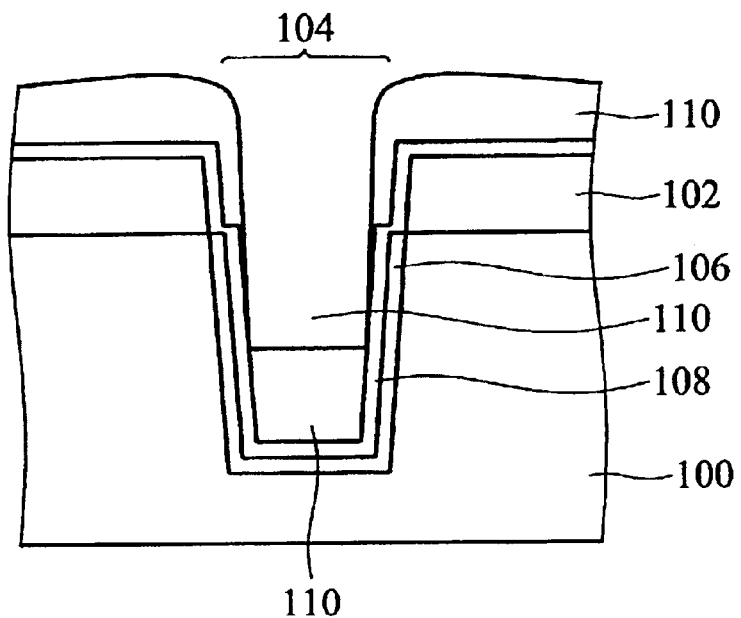

When the aspect ratio of the trench 104 is greater than 3, it is hard to achieve thorough coverage of the trench 104 by one step deposition of the first oxide layer 110. There are usually voids or seams formed on the upper portion of the first oxide layer 110. Therefore, spray etching is performed to eliminate the upper portion of the first oxide layer 110 where voids and seams are usually formed and the lower portion of the first oxide layer is retained, as FIG. 1E shows.

According to the present invention, the spray etching is performed with the mixture of hydrofluoric acid (HF) and sulfuric acid ($H_2SO_4$) as the etching solution to etch the first oxide layer 110. A preferred recipe of the spray etching solution is $HF/H_2SO_4$=0.3~0.4 which has a high etching selectivity between the first oxide layer 110 and the nitride layer 108.

Figure 2:
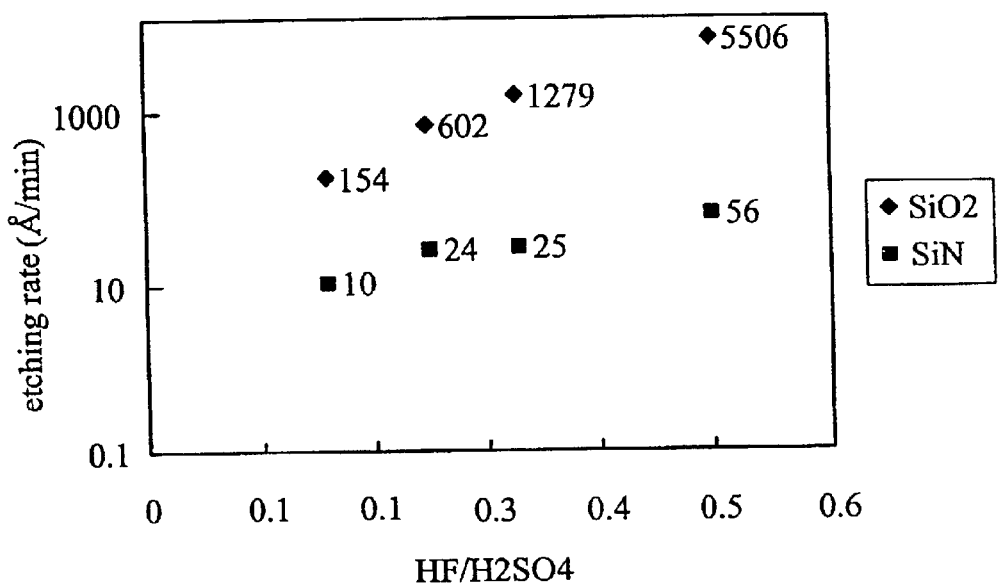
FIG. 2 is a drawing showing the etching rate of the first oxide layer in different ratios of $HF/H_2SO_4$ spray etching solution.

FIG. 2 shows the etching rate of the first oxide layer in different ratios of $HF/H_2SO_4$ spray etching solution. When the ratio of the $HF/H_2SO_4$ etching solution is between 0.3~0.4, the etching rate of silicon oxide ($SiO_2$) 110 is 1279 Å/min and the etching rate of the nitride layer 108 is only 25 Å/min. Therefore, using the $HF/H_2SO_4$ etching solution with a ratio between 0.3~0.4, the first oxide layer 110 can be etched rapidly without over-etching the profile of the liner nitride 108 in the trench 104.

Accordingly, the first oxide layer 110 is spray etched with a $HF/H_2SO_4$ etching solution in the ratio of 0.3~0.4. In a preferred condition, the first oxide layer 110 is spray etched with a etching solution of $HF/H_2SO_4$=1:2 for 20~30 seconds.

Figure 1F:
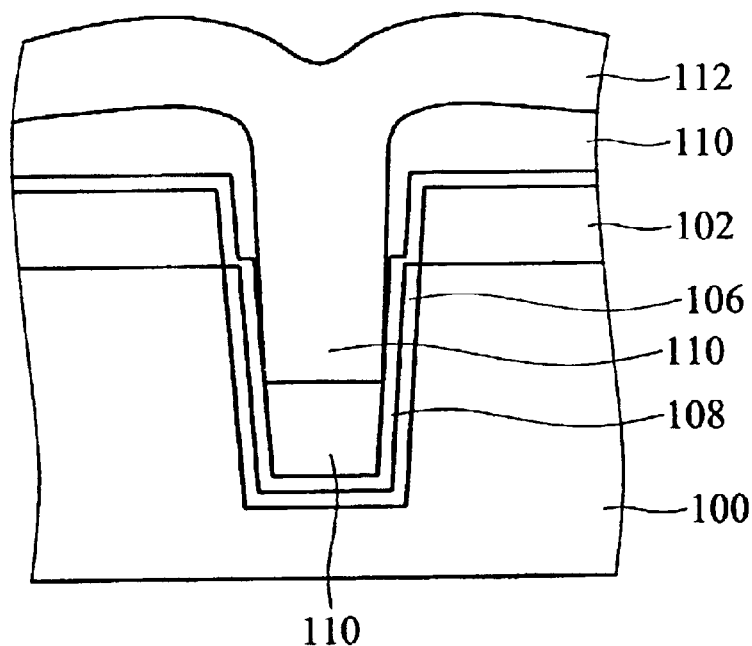

As shown in FIG. 1F, second oxide layer 112 is deposited subsequently to fill the trench 104 by HDPCVD. The second oxide layer 112 can be deposited in silane and oxygen by HDPCVD to form a silane based HDP oxide layer. The preferred deposition thickness of the second oxide layer 112 is about 3000~6000 Å and a more preferred thickness is about 4000 Å.

In a preferred embodiment, after the trench 104 is filled with the first and second oxide layers, the silicon substrate is subjected to thermal annealing process to increase the density of the oxide layer 112 as a good insulating area.

Figure 1G:
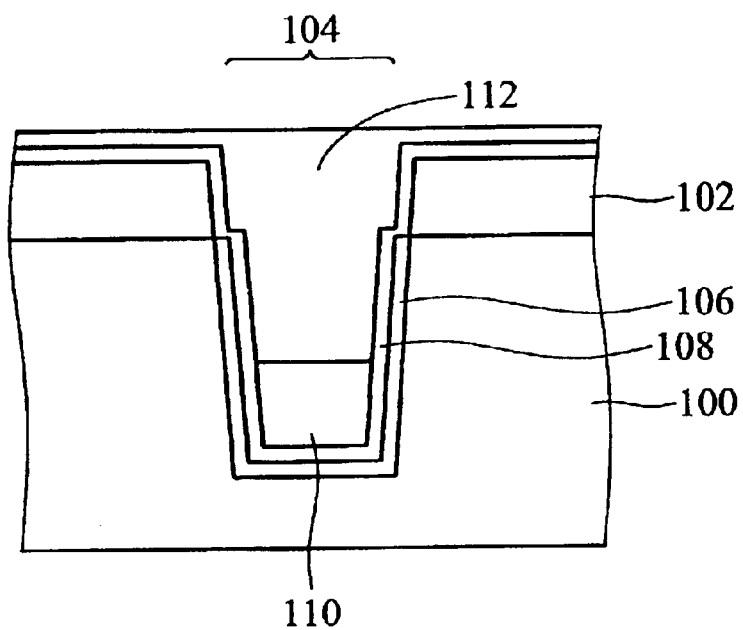

Finally, the second oxide layer is planarized by chemical mechanical polishing (CMP) to form a well-deposited shallow trench isolation, as FIG. 1G shows.

The characteristic of the method according to the present invention is to fill the insulating material in the trench by two-step deposition, which is very suitable for forming a high aspect ratio STI structure in a semiconductor substrate. The upper portion with voids and seams of the first oxide layer 110 is eliminated by spray etching. The spray etching solution is chosen as the mixture of $HF/H_2SO_4$ in a ratio between 0.3~0.4, which achieves the high etching selectivity between the silicon oxide and nitride. Therefore, according to the present invention, the insulating oxide layer can be etched rapidly without over-etching the liner in the trench 104.

Accordingly, the advantage of the present invention is to form, by two-step deposition, a well-deposited shallow trench isolation structure without voids or seams.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method of fabricating a shallow trench isolation structure in a semiconductor substrate, comprising steps of:

forming a trench on the semiconductor substrate;

forming a liner oxide on the bottom and sidewall of the trench;

forming a liner nitride on the liner oxide;

depositing a first oxide layer in the trench by high density plasma chemical vapor deposition;

spray etching the first oxide layer to a predetermined depth, wherein the recipe of the spray etching solution is $HF/H_2SO_4$=0.3~0.4; and depositing a second oxide layer to fill the trench by high density plasma chemical vapor deposition.

2. The method as claimed in claim 1, wherein the trench has an aspect ratio greater than 3.

3. The method as claimed in claim 1, further comprising a step of annealing the second oxide layer to increase the density thereof after the second oxide layer is deposited.

4. The method as claimed in claim 3, further comprising a step of performing chemical-mechanical polishing to planarize the surface of the second oxide layer after annealing.

5. The method as claimed in claim 1, wherein the trench is formed by reactive ion etching.

6. The method as claimed in claim 1, wherein the liner oxide is formed by thermal oxidation.

7. The method as claimed in claim 1, wherein the liner nitride is formed by low pressure CVD.

8. The method as claimed in claim 1, wherein the spray etching is performed for about 20–30 seconds.

9. The method as claimed in claim 8, wherein the recipe of the spray etching solution is $HF:H_2SO_4$=1:2.

10. The method as claimed in claim 1, wherein the deposited thickness of the first oxide layer in the trench is about 2000–5000 Å.

11. The method as claimed in claim 1, wherein the deposited thickness of the second oxide layer in the trench is about 3000–6000 Å.

12. The method as claimed in claim 1, wherein the first and second oxide layers comprise silane based HDP oxide.

13. A method of fabricating a shallow trench isolation structure in a semiconductor substrate, comprising steps of:

forming a trench on the semiconductor substrate, wherein the trench has an aspect ratio greater than 3;

forming a liner oxide on the bottom and sidewall of the trench by thermal oxidation;

forming a liner nitride on the liner oxide by low pressure CVD;

depositing a first oxide layer in the trench by high density plasma chemical vapor deposition;

spray etching the first oxide layer to a predetermined depth, wherein the recipe of the spray etching solution is $HF/H_2SO_4$=0.3~0.4;

depositing a second oxide layer to fill the trench by high density plasma chemical vapor deposition; and performing chemical-mechanical polishing to planarize the surface of the second oxide layer.

14. The method as claimed in claim 13, further comprising a step of annealing the second oxide layer to increase the density thereof after the second oxide layer is deposited.

15. The method as claimed in claim 13, wherein the trench is formed by a reactive ion etching.

16. The method as claimed in claim 13, wherein spray etching is performed with a spray etching solution for 20–30 seconds.

17. The method as claimed in claim 13, wherein the deposited thickness of the first oxide layer in the trench is about 2000–5000 521.

18. The method as claimed in claim 13, wherein the he deposited thickness of the second oxide layer in the trench is about 3000–6000 521.

19. The method as claimed in claim 13, wherein the first and second oxide layers comprise silane based HDP oxide.

\* \* \* \* \*